United States Patent [19]

Swift

[11] Patent Number: 4,573,759
[45] Date of Patent: Mar. 4, 1986

[54] OPTICAL DISPLAY APPARATUS

[75] Inventor: David W. Swift, Prestatyn, Wales

[73] Assignee: Pilkington P.E. Limited, United Kingdom

[21] Appl. No.: 390,520

[22] Filed: Jun. 21, 1982

[30] Foreign Application Priority Data

Jul. 7, 1981 [GB] United Kingdom ............... 8120875

[51] Int. Cl.⁴ .............................................. G03H 1/22
[52] U.S. Cl. .................................................. 350/3.85
[58] Field of Search .................. 340/705, 716, 734;
350/3.85, 3.77, 3.6, 3.75, 3.77, 3.85, 3.86, 3.81,
319

[56] References Cited

U.S. PATENT DOCUMENTS 3,708,217  1/1973  McMahon ............................. 350/3.7
4,165,930  8/1979  Matsumoto et al. ............... 350/3.85
4,420,218 12/1983  Rubanou et al. ................... 350/3.85

FOREIGN PATENT DOCUMENTS 1505873  3/1978  United Kingdom .

OTHER PUBLICATIONS

Saxby, Graham, *Holograms,* p. 44, Focal Press Limited, London, 1980.

Primary Examiner—Bruce Y. Arnold
Attorney, Agent, or Firm—F. Eugene Davis, IV

[57] ABSTRACT

A relatively simple dual display system, e.g. a map or stand-by graticule superimposed on a radar or main display, is provided by use of holography. A holographic element when illuminated with a reconstruction beam from a light source provides a holographic image of visual information at a postiion behind and spaced from the element itself. The element is mounted an appropriate distance in front of a cathode ray tube such that the holographic image appears at the phosphor surface superimposed on and coincident with the CRT display.

12 Claims, 3 Drawing Figures

OPTICAL DISPLAY APPARATUS

BACKGROUND OF THE INVENTION

This invention concerns improvements in or relating to optical display apparatus.

In some circumstances there is a requirement for displaying two sets of visual information simultaneously in superimposed manner to an observer. For example, it is sometimes required in a head-down display to superimpose a map display on e.g. a radar display on a cathode ray tube (CRT) phosphor, or in a head-up display to superimpose a stand-by display of a graticule or the like on a main display on a CRT phosphor. Conventionally such superimposition is effected by some form of beam-splitter arrangement whereby light from one display, e.g. the CRT, is transmitted through the beam-splitter while light from the other display, e.g. the map or stand-by, is reflected from the beam-splitter. These beam-splitter arrangements generally tend to entail space, weight and cost penalties. There are other more simple options but these also tend to have their disadvantages. For example, a head-down display may have a CRT with a fibre optics faceplate and a transparency, e.g. showing a map, in contact with it. This means a more expensive CRT and puts constraints on the display itself since it alone illuminates the transparency. In a head-up display it has been proposed to focus light from a stand-by display source on to the CRT phosphor of the main display but this can have brightness problems.

SUMMARY

According to the present invention there is provided optical display apparatus comprising a display source, such as a CRT, having a display surface, such as the CRT phosphor, on which first visual information can be displayed, a holographic element, such as a plate or film, providing a holographic record of second visual information, for example a map display or a stand-by display such as a graticule, recorded so that the holographic image appears at a distance behind the holographic element, means mounting the holographic element at a corresponding distance in front of the display surface, and means for illuminating the holographic element so that the holographic image appears at the display surface. With such arrangement the second visual information can be displayed superimposed on and coincident with the display of the first visual information.

Preferably the holographic element comprises a phase hologram since an amplitude hologram may undesirably absorb some of the light from the display source.

A hologram may be constructed in the holographic element by light from a coherent source which is transmitted through the element and then reflected back thereto from an object providing a representation of the second visual information, e.g. a map or graticule, and preferably comprising a diffuse reflector in the bright areas and an absorber in the dark areas. The hologram is formed by interference between the direct reference beam and the reflected beam from the object. If desired means, such as a glass plate, may be interposed between the element and the object to modify optically the effective distance of the object from the element, and hence the distance at which the holographic image appears behind the element. Alternatively, the hologram may be constructed by the use of two light beams from respective coherent sources, which may in practice be optically generated from a single source, one light beam being a reference beam incident on the element from the front and the other beam being transmitted through the object, which in this case is transmissive in the bright areas and opaque in the dark areas such as a transparency, and then incident on th element from behind. The hologram is formed by interference between these beams. If desired a lens may be used in association with the object during the hologram construction in order to concentrate the light to the observation position.

It will be understood that the means for illuminating the holographic element in use is arranged to effect illumination from a direction corresponding to the reference beam direction during construction. If desired the holographic element may provide a plurality of independent holographic images, each constructed with a different reference beam direction, and the means for illuminating the holographic element may comprise switchable means for switching the illumination between corresponding different directions whereby a required image can be selected.

BRIEF DESCRIPTION OF THE DRAWINGS

Apparatus in accordance with the invention will now be described, by way of example, with reference to the accompanying drawings in which.

DESCRIPTION OF THE PREFERRED EMBODIMENTS

Figure 1:
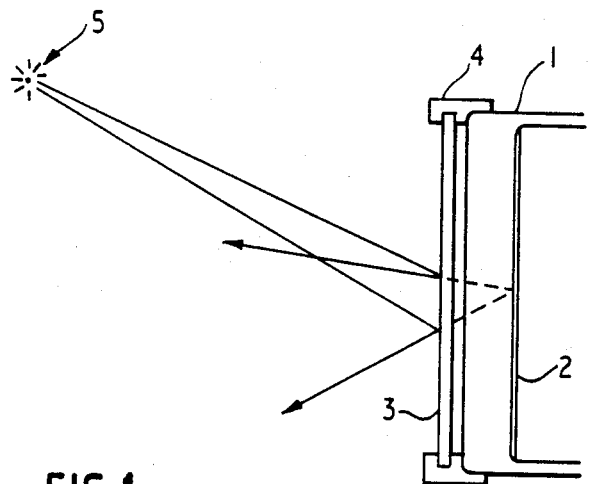
FIG. 1 is a schematic representation of an embodiment of optical display apparatus, FIG. 2 schematically illustrates a hologram construction arrangement, and FIG. 3 schematically illustrates an alternative hologram construction arrangement.

FIG. 1 schematically shows a display source in the form of a CRT 1 having a phosphor 2 providing a display surface on which first visual information is displayed. A holographic element 3, which may be a plate or a film, is mounted by a mounting member 4 in front of the CRT 1 at a distance from the phosphor 2. The holographic element 3 provides a holographic record of second visual information recorded (by construction of a reflection hologram in a manner described later) so that the holographic image appears at a distance behind the element corresponding to the distance of the element from the CRT phosphor 2. Illuminating means comprising a light source 5 illuminates the holographic element 3 from the front so that the holographic image appears at the phosphor 2. Thus the second visual information of the holographic image is displayed superimposed on and coincident with the display of the first visual information on the CRT phosphor. An observer, represented by an eye E, looking towards the CRT can therefore see both sets of visual information simultaneously in superimposed coincident relationship, the CRT display being seen by way of light from the phosphor 2 transmitted through the holographic element 3, and the holographic display being seen by way of light from the source 5 reflected from the holographic element 3. The holographic display may for example be a map and the CRT display a radar display, or the holographic display may for example be a graticule providing a stand-by display for a main display on the CRT.

Figure 2:
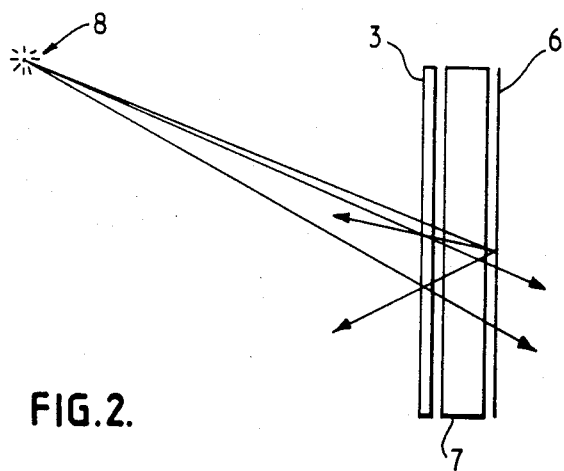

Construction of the hologram in the holographic element 3 may be effected as schematically shown in FIG. 2. An object 6 providing a representation of the second visual information, e.g. a map or graticule, is positioned at the required distance behind the element 3, the object being diffusely reflecting in the bright areas and absorbing in the dark areas. The object 6 may be positioned at the necessary physical distance from the element 3 for the required image location, or optionally a glass plate 7 may be interposed between the object and the element to modify optically the effective distance. This option may be convenient to provide an equivalent effect to the CRT glass face plate in front of the phosphor 2. To construct the hologram light from a coherent source 8, such as a laser, at a location equivalent to that of the illuminating source 5 in FIG. 1, is transmitted through the element 3 and reflected back from the object 6. There is interference at the element 3 between the direct light, which constitutes a reference beam, and the reflected beam from the object. A conventional three dimensional hologram is in fact produced but with a two-dimensional planar object 6 the third dimension is employed simply to locate the image in the correct plane on reconstruction. The hologram is a phase hologram since it is required not to absorb light from the CRT in use. An amplitude hologram would absorb some of the light from the CRT but could be used if such absorption is tolerable.

Figure 3:
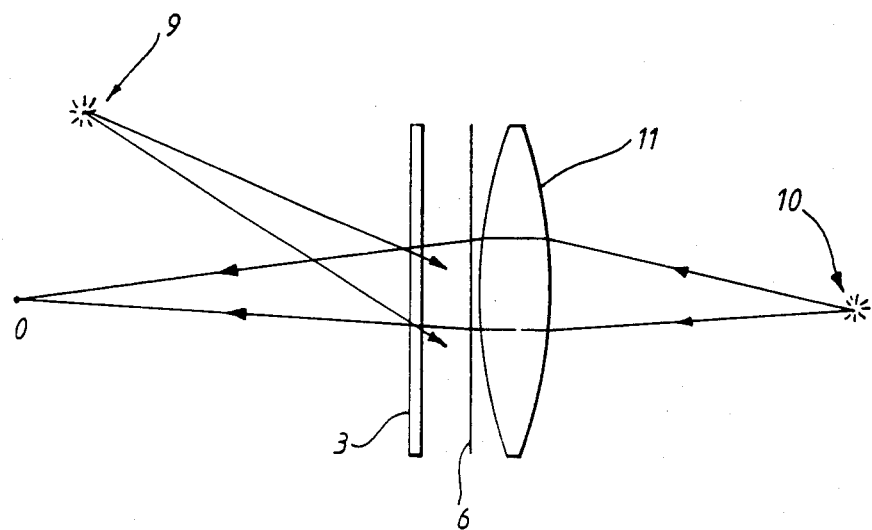

Construction of the hologram in the holographic element 3 may alternatively be effected as schematically shown in FIG. 3. In this case the object 6, e.g. a map or graticule, is a transparency which is transmissive in the bright areas and opaque in the dark areas. This is located behind the element 3 at a distance corresponding to the required image location. A reference beam of light from a first coherent source 9 is incident on the element 3 from the front while a further beam of light from a second coherent source 10 is transmitted through the object 6 and incident on the element 3 from the back. The hologram is formed by interference between these two beams. In practice the two coherent sources 9 and 10 are optically generated from a single source, such as a laser, by use of mirrors or the like which effect the required location of the effective sources 9 and 10.

FIG. 3 further shows a lens 11 disposed between the source 10 and the object 6. This lens serves to concentrate the light to the observation position O, corresponding to the eye position E in FIG. 1, so as to improve the light utilisation and hence the brightness of the holographic image. A lens could also be used for this purpose in a hologram construction arrangement like that of FIG. 2, the lens being located either between the source 8 and the element 3 or between the object 6 and the element 3. If a specularly reflecting object is employed provision should be made to effect correct location of the image, for example a light diffuser such as a holographic scatter plate may be located in the object plane.

It will be understood that in the apparatus schematically shown in FIG. 1 the illuminating light source 5, which may be a broad band or a narrow band source, is located so that the illuminating or reconstruction beam is incident on the element 3 from the same direction as the reference beam was during construction of the hologram. For convenience FIG. 1 shows the observer viewing the display directly whereas in practice the diplay is likely to be viewed by means of a monocular or biocular magnifier. However, this need not present any problems since the reconstruction source 5 can be located anywhere convenient (probably above and slightly forward of the eye line) and can illuminate the holographic element 3 through all or part of the magnifier. The shape of the beam does not itself matter so long as it accords with that used in the hologram construction. Thus desirably the hologram is constructed using similar optics to those employed in the display apparatus, but this is not very critical and may not necessarily be essential. It is generally sufficient that the hologram be constructed in a manner such that the holographic image appears with adequate brightness and clarity under the illuminating arrangement operative in the display apparatus.

FIG. 1 shows a planar CRT phosphor 2 and FIGS. 2 and 3 show a correspondingly planar object 6 so that a planar holographic image is produced which in use coincides with the planar phosphor 2, the third dimension of the hologram being used as previously mentioned to effect this image location. It will be appreciated that, if the display source has a curved display surface, then the object can be correspondingly curved so that a curved holographic image is produced which in use coincides with the curved display surface. In this case the third dimension of the hologram is used to provide the image curvature and the image location.

The holographic element 3 may for example be a plate, and a series of such holographic plates may be provided each having a holographic record of different visual information so that a selected plate can be placed in front of the CRT 1 to provide (superimposed on the CRT display) a display of the visual information required at the time. In this case the mounting means 4 is preferably such as to permit ready removal of a plate and insertion of another plate in front of the CRT. As a further example the holographic element 3 may be a film which may comprise a series of frames each providing a holographic record of different visual information, or which may have a holographic record of visual information extending continuously along the film. In this case the means mounting the holographic element in front of the CRT may comprise a pair of spools and means for winding the film past the CRT so as to locate a selected part, e.g. a selected frame, in front of the phosphor.

The holographic element 3 may comprise a plurality of effectively superimposed holograms on the same substrate, each constructed independently with a different reference beam direction. The display apparatus may then comprise switchable illuminating means, such as a plurality of illuminating sources 5 which can be switched on and off separately disposed at different locations, to illuminate the element 3 from corresponding different directions so that one or more required holographic images can be selected for display. The several holograms can provide a record of several sets of visual information, e.g. maps, which can be selectively displayed from the same holographic element, or the same part of a holographic element, located in front of the CRT phosphor. Such arrangement can therefore save space on visual information record storage.

It will be seen that with the holographic image located at a different position, and particularly in a different plane, from the holographic element 3 itself, the possible adverse effect of dust, scratches or the like on the holographic element is reduced.

It will be understood that the previously mentioned specific forms of visual information, namely a map which may be superimposed or overlayed on a CRT radar display, or a stand-by graticule which may be superimposed on a CRT main display, are given by way of illustration and example and any suitable form of visual information could be employed. It will further be understood that a CRT is given by way of illustration and example of a display source having a display surface and other forms of display source, such as by way of further example an image intensifier tube, could be employed.

The display apparatus may be used in head-down mode, or may provide a head-up display with viewing via a combiner whereby the display is superimposed on a view of the outside world. Although the apparatus is particularly suitable for effecting superimposition of first and second visual information, it has the facility for displaying either separately. For example in FIG. 1 the illuminating source 5 can be switched off and the observer can view the CRT display alone, or the CRT can be switched off and the observer can view the holographic display alone. Similarly, in the event of failure of the illuminating source or of the CRT the observer can retain a view of the CRT or the holographic display respectively.

The holographic record may be made by use of a diffusely reflecting object or a specularly reflecting object or some intermediate form of reflecting object, and it will be appreciated that references to diffuse reflection and specular reflection in this context do not mean that the reflection needs to be at the respective extreme of the diffuse-intermediate-specular continuum. A diffuse reflector effects correct image location but in use relatively little of the reflected light actually reaches the observer's eyes. With a specular reflector there is much improved light utilisation but provision should be made for correct location of the image (which otherwise appears to be in the plane of the holographic element). Such possible photometry problems are generally less with a "thick" hologram and a narrow band source than with a "thin" hologram and a white light source. In principle high efficiency of light utilisation and correct image location could be provided by reflectivity over a fixed small angular range but this can be difficult to effect in practice. A possible alternative is to use a specularly reflecting object and to record two holograms with the same object, holographic element, and reference beam source locations, but with different "sink" positions corresponding to the respective eye positions. Thus, for example with a construction arrangement as shown in FIG. 3, one hologram is made with the source 10 and lens 11 arranged so that point O is at one (say the left) eye position, and the second hologram is then made with the source 10 and lens 11 arranged so that point O is at the other (the right) eye position, the locations of the source 9, element 3, and object 6 being the same for construction of both the holograms. On reconstruction, i.e. in use in the display apparatus, each eye sees its own holographic image which is correctly located at the display surface. Preferably "thick" holograms are employed to reduce or prevent ghost problems. This possibility of more than one hologram may be extended so as to record several holograms, each with a slightly different "sink" position, thereby providing a distribution of holographic images viewable by the observer.

Hence, the invention further provides that the holographic element may comprise a hologram constructed using means to concentrate to an observation position light travelling from an object providing a representation of the second visual information and which passes through the holographic element, and may comprise a plurality of holograms constructed with such light concentrated to respective different observation positions, and may in particular comprise two similar holograms constructed with such light concentrated to two respective observation positions corresponding to an observer's two eye positions.

It has been mentioned above that location of the holographic image at a different position from the holographic element itself can reduce possible adverse effects of dust etc, on the holographic element or substrate. The holographic element can in practice be sufficiently spaced from the CRT faceplate to permit provision of a cover plate which protects the holographic element from dust and dirt. Further, spacing of the holographic element from the CRT faceplate can simplify the facility of adjustability relatively to the faceplate. Thus, for example, a holographic element having a recorded graticule can readily be movable in a plane parallel to the faceplate, so that the graticule image can be moved relatively to the CRT display while maintaining the graticule image in a plane coincident with that of the CRT display and therefore in focus to the observer. The space between the face plate and the holographic element avoids the need for precision mechanics or a lubricant layer, as may be required with prior systems where the graticule is in physical contact with the faceplate. Thus, location of the holographic image at a position spaced from the holographic element can be advantageous even with a CRT having a fibre-optic faceplate at the front surface of which the image appears.

It will be appreciated that the hologram substrate may be planar, as shown in the drawings, but could, if desired, be non-planar, for example curved, e.g. with spherical or cylindrical curvature.

I claim:

1. Optical display apparatus comprising a display source having a display surface on which first visual information can be displayed, a holographic element providing a reflection hologram of second visual information recorded so as to define a holographic image surface of a configuration corresponding to the configuration of the display surface and located at a distance behind the holographic element, means mounting the holographic element at a corresponding distance in front of the display surface, and means located in front of the holographic element for illuminating the element so that the holographic image surface coincides with the display surface.

2. Apparatus according to claim 1 in which the holographic element comprises a phase hologram.

3. Apparatus according to claim 1 or claim 2 in which the holographic element comprises a hologram constructed by light from a coherent source which is transmitted through the element and then reflected back thereto from an object providing a representation of the second visual information.

4. Apparatus according to claim 3 in which the hologram is constructed by use of an object comprising a diffuse reflector in the bright areas and an absorber in the dark areas.

5. Apparatus according to claim 3 in which the hologram is constructed with means interposed between holographic element and the object to modify optically the optical path length of the object from the element.

6. Apparatus according to claim 1 or claim 2 in which the holographic element comprises a hologram constructed by the use of two coherent light beams, one light beam being a reference beam incident on the element from the front and the other beam being transmitted through an object providing a representation of the second visual information and then incident on the element from behind.

7. Apparatus according to claim 1 or claim 2 in which the holographic element comprises a hologram constructed by interference at the holographic element between a reference light beam incident on the element and another light beam converging towards an observation position corresponding to an observer's eye position and transmitted through the element from an object which provides a representation of the second visual information.

8. Apparatus according claim 7 in which the holographic element comprises a plurality of holograms constructed with said respective other light beams concentrated to respective different observation positions.

9. Apparatus according to claim 8 in which the holographic element comprises two holograms constructed with said respective other light beams concentrated to two respective observation positions corresponding to an observer's two eye positions.

10. Apparatus according claim 1 or claim 2 in which the holographic element provides a plurality of independent holographic images, each constructed with a different reference beam direction, and the means for illuminating the holographic element comprises switchable means for switching the illumination between corresponding different directions whereby a required image can be selected.

11. Apparatus according to claim 1 in which the display surface, and the holographic record of said second visual information, are planar.

12. Apparatus according to claim 1 in which the display surface, and the holographic record of said second visual information, are correspondingly curved.

* * * * *